Feb. 14, 1967 TERUO HAYASHI ET AL 3,304,470

NEGATIVE RESISTANCE SEMICONDUCTOR DEVICE UTILIZING TUNNEL EFFECT

Filed March 3, 1964 2 Sheets-Sheet 1

INVENTORS
TERUO HAYASHI
HISASHI WATANABE
YOSHIHIRO SOTOME
BY
Hopgood & Calimafde
ATTORNEYS INVENTORS
TERUO HAYASHI
HISASHI WATANABE
BY YOSHIHIRO SOTOME
Hopgood & Calimafde
ATTORNEYS 3,304,470
Patented Feb. 14, 1967

3,304,470

NEGATIVE RESISTANCE SEMICONDUCTOR DEVICE UTILIZING TUNNEL EFFECT

Teruo Hayashi, Hisashi Watanabe, and Yoshihiro Sotome, all of Tokyo, Japan, assignors to Nippon Electric Company Limited, Tokyo, Japan, a corporation of Japan Filed Mar. 3, 1964, Ser. No. 349,185
Claims priority, application Japan, Mar. 14, 1963, 38/13,157
5 Claims. (Cl. 317—235)

This invention relates to a semiconductor device which is capable of exhibiting controllable negative resistance characteristics and to a method for making such devices.

It is an object of this invention to provide a new semiconductor device which exhibits a negative resistance characteristic when used as a two terminal device, and which characteristic can be controlled by the application of current to a third terminal of said device.

Another object of this invention is to provide a method for making a semiconductor device which has a negative resistance characteristic that can be controlled during operation of the device.

A further object is to make available a novel three terminal semiconductor device which can be employed to energize a circuit connected to a first pair of said terminals by the application of a control pulse to a second pair of said terminals.

Figure 1:
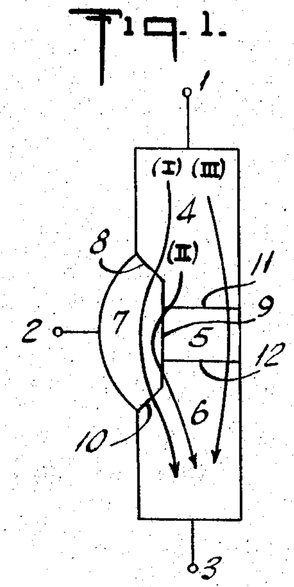
Figure 2:
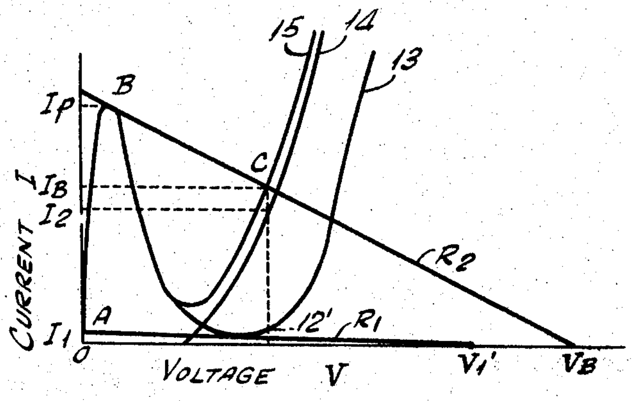
Figure 3:
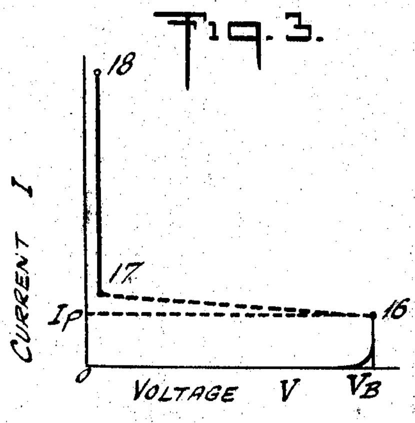
Figure 4:
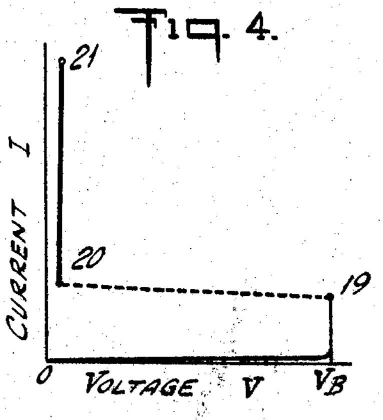
Figure 5:
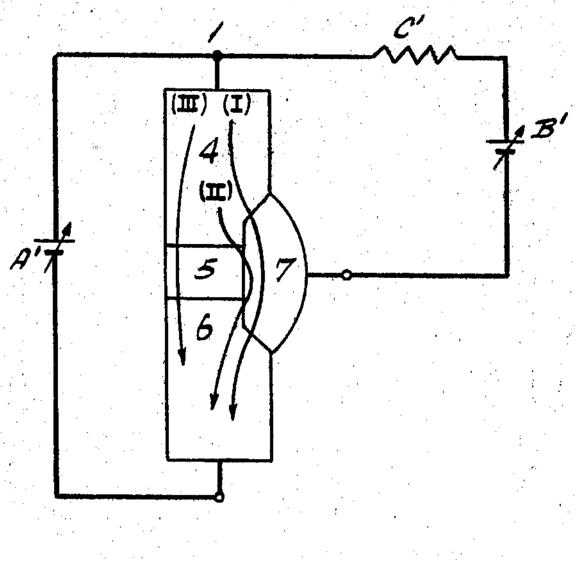
Figures 6, 8:
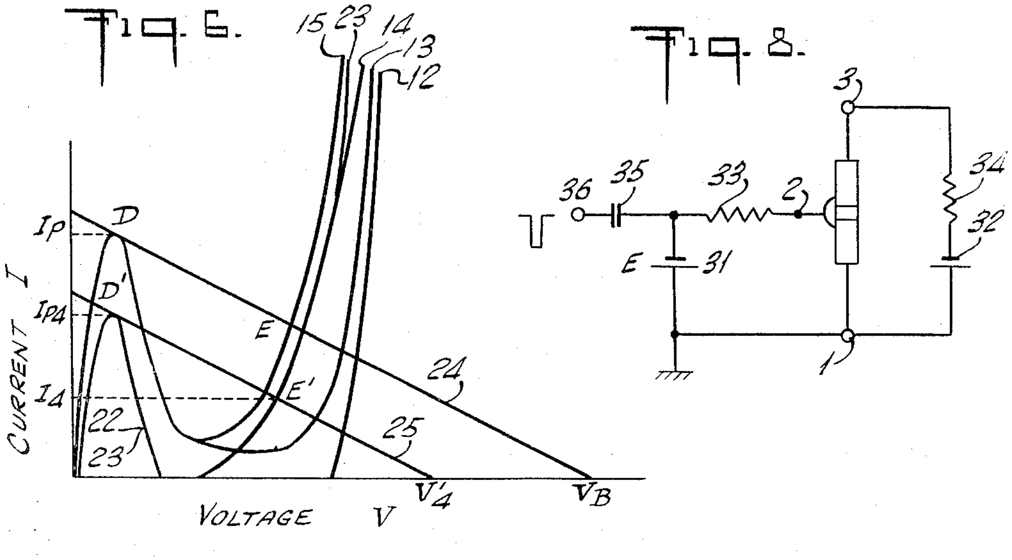
Figure 7:
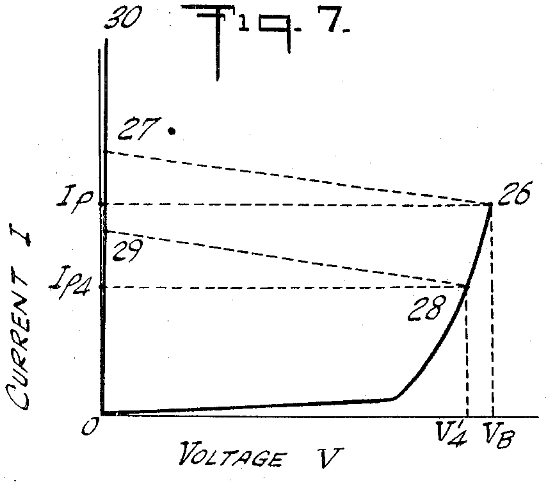
Figure 9:
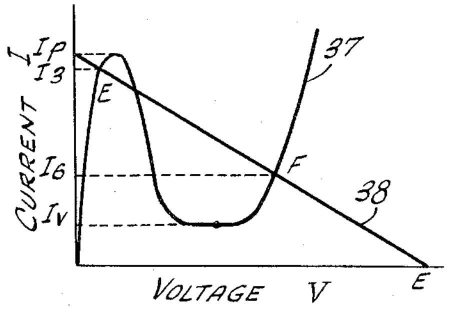
Figure 10:
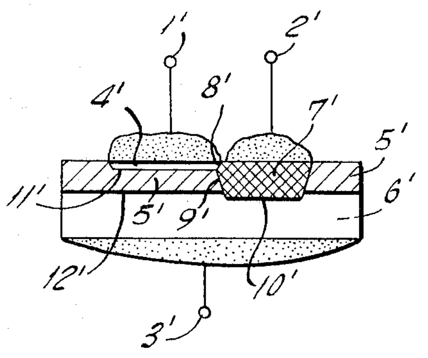

All of the objects, features and advantages of this invention and the manner of attaining them will become more apparent and the invention itself will be best understood by reference to the following description of an embodiment of the invention taken in conjunction with the accompanying drawing, in which FIG. 1 is a cross sectional view of a semiconductor device constructed according to the invention, FIG. 2 is the voltage-current characteristic at the terminals 1 and 2 of the semiconductor device of FIG. 1, FIG. 3 is the voltage-current characteristic at the terminals 1 and 3 of the device of FIG. 1, FIG. 4 is the voltage-current characteristic at the terminals 2 and 3 of the device of FIG. 1, FIG. 5 is a schematic circuit diagram for a semiconductor device according to this invention which is used as a three terminal device, FIG. 6 is the voltage-current characteristic at the terminals 1 and 2 of the device in FIG. 5, FIG. 7 is the voltage-current characteristic at the terminals 1 and 3 of the device in FIG. 5, FIG. 8 shows another schematic circuit diagram for the device of the invention when used as a three terminal device, FIG. 9 is the input voltage-current characteristic of the semiconductor device in FIG. 8, and FIG. 10 shows an alternative embodiment of the semiconductor device of the invention.

Referring now to FIG. 1, a semiconductor device made according to the invention is shown in which the numerals 1, 2 and 3 are the terminals of the device and 4, 5, 6 and 7 comprise different regions of semiconductor material. The numeral 8 indicates the junction between the semiconductor regions 4 and 7, 9 is the junction between the regions 5 and 7, 10 is the junction between the regions 6 and 7, 11 is the junction between the regions 4 and 5, and 12 is the junction between the regions 5 and 6. Germanium, for example, can be used as the semiconductor material, the region 4 being of p-type conductivity with an extremely narrow junction width at which a tunneling effect takes place, as will be seen. The region 5 is of opposite or n-type conductivity. The junctions 10, 11 and 12 are $pn^+$, $p^+n$ and pn junctions, respectively, and 9 is an $nn^+$ junction. The leads to the terminals 1, 2 and 3 make ohmic contact to regions 4, 7 and 6, respectively.

Such a semiconductor device shows a voltage-current characteristic at the terminals 1 and 2 with a negative resistance corresponding to that of an ordinary tunnel diode, as shown by the curve 15 in FIG. 2, when the terminal 1 is made positive with respect to the terminal 2. A negative resistance between the terminals 1 and 3 is produced as shown by the portion of the curve between the points 16 and 17 in FIG. 3, when the terminal 1 is made positive with respect to the terminal 3. The voltage-current characteristic between the terminals 2 and 3 has negative resistance between the points 19 and 20 in the curve shown in FIG. 4.

The principle of operation of the semiconductor device in accordance with this invention will now be explained. First, consider that a voltage is applied across the terminals 1 and 2 in FIG. 1, the terminal 1 being made positive and the terminal 2 being made negative with respect thereto. This voltage produces three components of current between the terminals 1 and 2; these components are: (a) a current component from the region 4 to the region 7 through the junction 8; (b) a current component from the region 4 to the region 7 through the junction 11, the region 5 and the junction 9; and (c) a current component from the region 4 to the region 7 through the junction 11, the region 5, the junction 12, the region 6 and the junction 10. As the junction 8 is a tunnel junction, the current component through the route 4→8→7 corresponds, as the curve 13 shows in FIG. 2, to the voltage across the terminals 1 and 2. As the junction 9 is an $nn^+$ junction, the voltage drop across this junction is negligibly small, and as the junction 11 is a $p^+n$ junction biased in the forward direction, the current component through the route 4→11→5→7 corresponds, as shown by the curve 14 in FIG. 2, to the voltage across the terminals 1 and 2. On the other hand, as the junction 12 is reverse biased in the direction 5→12→6, the current component through the route 4→11→5→12→6→10→7 is approximately zero. Therefore, the voltage-current characteristic curve at the terminals 1 and 2 is the summation of the curve 13 and the curve 14 in FIG. 2, indicated by the numeral 15.

Next let us consider a voltage applied across the terminals 1 and 3, the terminal 1 being made positive and the terminal 3 being made negative. Under such condition, the regions 4, 5 and 6 constitute a $p^+np$ transistor in which the current from the region 1 to the region 3 comprises three components I, II and III as shown in FIG. 1. When this applied voltage is low, the junction 12, i.e., the pn junction between the regions 5 and 6, is reverse biased and hence the current component III is negligibly small. Also, the junction 10, i.e., the $pn^+$ junction between the regions 6 and 7, is reverse biased in the direction 7→10→6 and hence the current components I and II are very small. The current component III being negligibly small, when the applied voltage is small, the voltage-current characteristics are those of the series connection of the diodes between the terminals 1 and 2 and the resistance of the junction 10 is in the reverse direction. The voltage-current characteristics of the two diodes between the terminals 1 and 2 are shown in FIG. 2 by the numerals 13 and 14.

When the applied voltage is gradually raised to $V_1'$ in FIG. 2, the load characteristic for the diodes between the terminals 1 and 2 is as shown by the curve $R_1$, and a current $I_1$ flows between the terminals 1 and 3 having a value which is determined by the curve 15 and the resistance $R_1$ at their intersection. As already indicated the curve 15 is the sum of the curves 13 and 14 and the resistance $R_1$ is the D.C. reverse resistance of the junction 10 at the voltage $V_1'$. In this region where the load line intersects with the curve at only one point, there is no flow of the current component II, but only flow of the current component I, and hence the transistor composed of the regions 4, 5 and 6 is in its cut off region. Therefore the current $I_1$ is the only current flowing from the terminals 1 to 3 at the voltage $V_1'$; this current is shown in FIG. 3 by the curve 0–16. When the applied voltage approaches the value $V_B$, the reverse breakdown voltage of the junction 10, its reverse resistance decreases rapidly and the current component I increases rapidly. As soon as the reverse resistance of the junction 10 becomes $R_2$ as shown in FIG. 2 by the line $R_2$ at the voltage $V_B$, the operating point comes to the point B and suddenly jumps to the point C which is the intersection of the load line $R_2$ and the curve 15, at which time current $I_B$ flows from the regions 4 to 7, and consists of $I_2'$ (the component I), and $I_2$ (the component II). Consequently the transistor composed of the regions 4, 5 and 6 is suddenly biased in the forward direction due to the increase of the current component II, when the applied voltage is raised to $V_B$. This causes a sudden increase of the current component III and also a sudden decrease of the voltage across the terminals 1 and 3, and hence a negative resistance appears at the terminals 1 and 3. This is shown in FIG. 3 by the curve 16–17. As the junction 11 is forward biased, further increase in the applied voltage increases the current but does not increase the terminal voltage. This is shown in FIG. 3 by the curve 17–18.

When a voltage is applied across the terminals 2 and 3, the terminal 2 being made positive and the terminal 3 being made negative, a cut off region, 0–19, and a conducting region, 20–21 on the curve in FIG. 4, appear with an increasing voltage, showing a negative resistance between 19 and 20 in the figure.

The above characteristics result when the semi-conductor device in accordance with this invention is used as a two terminal device; the characteristics resulting when it is used as a three terminal device will now be discussed. FIG. 5 is a schematic circuit diagram with this semiconductor device connected as a three terminal device, wherein A′ and B′ are biasing sources for the terminals 1 and 3, and 1 and 2, respectively. When the bias across the terminals 1 and 2 is zero, the current components I and II flow as shown in FIG. 5 between the terminals 1 and 3, in the same manner as in FIG. 2. The voltage-current characteristics being analyzed in the same way as the two terminal connections discussed above, i.e., considering the two diodes between the terminals 1 and 2 and the reverse resistance of the junction 10 as a load for the two diodes, the curves 13 and 14 are the voltage-current characteristics of the two diodes, respectively, and the curve 15 is the sum of the two. By the same reasoning as in the case of the two terminal device described in connection with FIG. 2, when the voltage across the terminals 1 and 3 is increased to $V_B$, the load line for the terminals 1 and 2 is as shown by the line 24 in FIG. 6, and the operating point jumps from D to E. Hence the voltage-current characteristics at the terminals 1 and 3 are 0–26–27–30 as shown in FIG. 7. If a positive voltage is applied to the terminal 1 and a negative voltage to the terminal 2 so that a current $(I_P-I_{P4})$ flows between these two terminals, the curve 13 of FIG. 6 is lowered to 22, equivalently, and the overall voltage-current characteristics at the terminals 1 and 2 are lowered from the curve 15 to curve 23. Consequently, when the voltage across the terminals 1 and 2 is increased to $V_4'$ ($<V_B$) the operating point jumps from D′ to E′, increasing the current component II from zero to $I_4$ and biasing the junction 11 in the forward direction. This drives the current component III to a relatively large value. The voltage-current characteristics at the terminals 1 and 3 during this process are as shown in FIG. 7 by the curve 0–28–29–30. With a further increase in the current between the terminals 1 and 2, the point 28 decreases along the curve 0–26. Finally, if the bias source B′ supplies a current $I_p$ between the terminals 1 and 2, the voltage-current characteristics at the terminals 1 and 3 shift to 0–29–27–30, and hence the negative resistance between the terminals 1 and 3 disappears.

The operation of the three terminal device may also be explained from another standpoint, as follows. If a voltage $V_4'$ is applied across the terminals 1 and 3 in the circuit of FIG. 5 and if there is no circuit in the external circuit of the terminals 1 and 2, no current flows between the terminals 1 and 2 and hence the device is in a cutoff state. If the external source supplies a current of $(I_p-I_{p4})$ to the terminals 1 and 2, the device becomes conducting between the terminals 1 and 3. This fact makes it possible to control the state between the terminals 1 and 3 by the application of current between the terminals 1 and 2.

The significant characteristics of the device when three terminals are employed will now be described. FIG. 8 is one embodiment of a circuit using the device in this manner, this circuit comprising a power source in the form of a battery 32 and a load resistance 34 in a main circuit, a power source 31 and a resistance 33 in a control circuit, a coupling condenser 35 and an input terminal 36. The curve 37 in FIG. 9 shows an input voltage-current characteristic at the terminals 1 and 2 of the device employed in FIG. 8 and the line 38 is a load line determined by the battery 31 and resistor 33 of the control circuit in FIG. 8. Letting the voltage of the source 31 be represented by E, the resistance 33 is determined so as to give a load line 38 which intersects the curve 37 at two points E and F. The operating point of the circuit is at the point E before the input signal is applied, hence the device is in an "off" state between the terminals 1 and 3, as was previously discussed. If a negative current pulse whose magnitude is more than $(I_p-I_5)$ as shown in FIG. 9 is caused to flow into the input terminal 36, the operating point jumps to the point F and the device then becomes in the "on" condition between the terminals 1 and 3 as shown previously. Hence a current flows through the load resistance 34. If another signal which is a positive current pulse having a magnitude greater than $(I_6-I_v)$ is applied to the input terminals 36, the operating point jumps back from F to E and the device becomes "off" again between the terminals 1 and 3. By adjusting $(I_p-I_5)$ and $(I_6-I_v)$ to very small values, a large current through the main circuit can be turned "on" and "off" with a small input signal. The device in accordance with the present invention has the desirable characteristic that the main circuit can be reliably and repetitively turned "on" and "off" at precisely the same control circuit levels. Additionally, these levels are fairly close so that it is possible to control the main circuit with a very small input signal.

One method of manufacturing the device of this invention using germanium as the semiconductor material will now be discussed. The structure as seen in FIG. 1 may be made using a method similar to that employed for grown type transistors. As one example, a p-type germanium single crystal having a resistivity of 2 ohm-cm. is dipped in molten germanium with 0.5% of gallium and 0.01% of arsenic contained in suitable crystal growing apparatus. The p-type germanium is employed as a seed crystal, and pulled up to grow a single crystal from the molten germanium. Relatively large quantities of gallium and arsenic impurities are contained in the grown crystal, and these impurities diffuse into the seed crystal from the grown side of the crystal due to the high growing temperature. As the diffusion constant of arsenic in germanium is considerably larger than that of gallium, if the time required for growing such a crystal is approximately 10 minutes, an n-type layer with a thickness of 0.005 cm. and an average concentration of approximately $10^{17}$ As/cm.$^3$ is formed within the seed crystal near the boundary with the grown crystal due to the diffusion of arsenic. The grown crystal is of p-type conductivity with an extremely high impurity concentration, i.e., a much higher concentration of gallium such as approximately $7\times10^{19}$ Ga/cm.$^3$ than that of arsenic. From this crystal is cut a small piece in the shape shown in FIG. 1 having a seed crystal region, an n-type diffused region, and a grown crystal region. In FIG. 1, the numeral 4 corresponds to the p-type grown region having a high impurity concentration, 5 corresponds to the n-type diffused region, 6 corresponds to the p-type region having a resistivity of 2 ohm-cm. and 11 and 12 form a $p^+n$ junction and a pn junction, respectively. The region degenerate 7 is obtained by placing a 0.01 cm. indium ball containing 3% arsenic, on the small piece of crystal, the ball extending over the three regions, 4, 5 and 6, and heating to 480° C. to alloy them in an inactive atmosphere for 30 seconds. As the germanium region, having recrystallized from the alloy, has an arsenic concentration of $10^{20}$ As/cm.$^3$, 8 becomes a $p^+n^+$ junction, 9 becomes an $nn^+$ junction and 10 becomes a $pn^+$ junction. The electrode 2 is obtained simply by connecting a metallic wire to said alloy, and the electrodes 1 and 3 are obtained by alloying the electrode wires to the regions 4 and 6, respectively, with the aid of indium, gold, or other suitable metal containing 0.5–1% gallium in order to obtain nonrectifying contacts to these regions which are of p-type germanium crystal. The $p^+n^+$ junction formed between the regions 4 and 7 is electrolytically polished in a 10% sodium hydroxide solution until the area of the $p^+n^+$ junction is small enough to produce the desired peak current tunnel characteristics.

Another structural embodiment using germanium is shown in FIG. 10, and may be obtained by a method similar to that for manufacturing mesa type transistors. In FIG. 10, the region 6′ is a seed crystal of p-type conductivity with a resistivity of 2 ohm-cm., having an n-type region 5 formed thereon by diffusing arsenic into the region 6′ in a gaseous phase. Suitable diffusion may be carried out at approximately 650° C. for two hours. A 0.5 mm. diameter indium ball containing approximately 5% arsenic is placed upon the surface of the n-type diffused layer 5 and alloyed in an inactive atmosphere at 650° C. for 3 minutes, resulting in an $n^+$ recrystallized region as shown by the numeral 7′ in FIG. 10. A portion of the surface of the alloyed region 7′ is then removed and an indium ball 0.1 mm. in diameter containing 0.5% gallium is then placed to extend over this portion and part of the region 5′; application of 500° C. heat in an inactive atmosphere for 30 seconds will form a $p^+$ region, shown in FIG. 10 by the numeral 4′, adjacent the regions 5′ and 7′. Electrodes 1′, 3′ and 2′ are attached to the regions 4′, 6′ and 7′, respectively. Consequently, in FIG. 10, 8′ is a $p^+n^+$ junction, 9′ is an $nn^+$ junction 10′ is a $pn^+$ junction, 11′ is a $p^+n$ junction and 12′ is a pn junction. The $p^+n^+$ junction 8′ exhibits a tunnel diode characteristic between the terminals 1′ and 2′. The peak current of this characteristic is adjusted by using the method of electrolytic polishing referred to previously.

The structures of the above described embodiments are sealed in the same manner as a conventional transistor. However, the method of assembly is not limited to that specifically described. Moreover, it will be apparent to those skilled in the art that the semiconductor device in accordance with this invention may be made not only with germanium which has been described in the embodiments as a semiconducting material, but with silicon and other semiconductor materials which can produce a tunnel effect.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A semiconductor device having a negative resistance characteristic and comprising
- semiconductor regions of given type conductivity spaced from one another, one of said regions being a degenerate region with a high impurity concentration,
- a semiconductor layer of opposite type conductivity sandwiched between said regions of given type conductivity,
- a degenerate region with a high impurity concentration of the same type conductivity as said opposite type, said latter region being formed contiguous to said layer and said regions of given type conductivity,
- a tunnel junction formed at the juncture of said regions of high impurity concentration,
- terminals attached to each of said regions, whereby said negative resistance characteristic is obtained between said terminals connected to said regions of given type conductivity,
- said negative resistance being controllable by the voltage-current characteristic of the tunnel diode formed by said regions of high impurity concentration and said tunnel junction between these regions.

2. A semiconductor device having a negative resistance characteristic and comprising
- a first semiconductor region of given type conductivity,
- a second semiconductor region of given type conductivity spaced from said first region and having a high impurity concentration therein,
- a semiconductor layer of opposite type conductivity between said regions and forming a different junction with each of said regions,
- a degenerate semiconductor region of opposite type conductivity adjacent to and forming separate junctions with said layer and with each of said regions of given type conductivity,
- said junction between said region of high impurity concentration and said region of opposite type conductivity comprising a tunnel junction,
- and terminals connected to each of said regions, whereby a negative resistance characteristic is obtained between the terminals connected to said regions of given type conductivity,
- said negative resistance being controllable in accordance with the voltage-current characteristic of said tunnel junction.

3. The invention described in claim 2 wherein said junction between said region of high impurity concentration and said region of opposite type conductivity is a $p^+n^+$ junction.

4. The invention described in claim 2 wherein said region of opposite type conductivity comprises a region of recrystallization.

5. A semiconductor device having a negative resistance characteristic and comprising
- a first semiconductor region of given type conductivity,
- a second semiconductor region of given type conductivity spaced from said first region and having a high impurity concentration therein,
- a semiconductor layer of opposite type conductivity between said regions and forming a different junction with each of said regions,
- said junction between said first region and said layer comprising a pn junction and said junction between said second region and said layer comprising a $p^+n$ junction,
- a degenerate semiconductor region of opposite type conductivity adjacet to and forming different junctions with said layer and with each of said first and second regions, said junction between said region of opposite type conductivity and said second region comprising a junction having tunnel characteristics, said junction between said first region and said region of opposite type conductivity comprising a $pn^+$ junction and said junction between said layer and said region of opposite type conductivity comprising an $nn^+$ junction, and terminals connected to each of said regions, whereby said negative resistance characteristic is obtained between the terminals connected to said regions of given type conductivity, said negative resistance being controllable in accordance with the voltage-current characteristic of said tunnel junction.

References Cited by the Examiner

UNITED STATES PATENTS

| | | | |
|---|---|---|---|
| 2,666,814 | 1/1954 | Shockley | 317—235 |
| 2,792,540 | 5/1957 | Pfann | 317—235 |
| 2,915,647 | 12/1959 | Ebers et al. | 317—235 |
| 2,962,605 | 11/1960 | Grosvalet | 317—235 |
| 2,971,140 | 2/1961 | Chappey et al. | 317—235 |
| 3,079,512 | 2/1963 | Rutz | 317—235 |
| 3,171,042 | 2/1965 | Matare | 317—235 |
| 3,175,934 | 3/1965 | Tomano et al. | 317—235 |
| 3,219,837 | 11/1965 | Nakarhara | 317—235 |

FOREIGN PATENTS

| | | |
|---|---|---|
| 909,522 | 10/1962 | Great Britain. |

JOHN W. HUCKERT, *Primary Examiner.*

J. D. CRAIG, *Assistant Examiner.*